(12) United States Patent
Li et al.

(10) Patent No.: US 11,923,024 B2
(45) Date of Patent: Mar. 5, 2024

(54) METHOD AND SYSTEM FOR TESTING OF MEMORY

(71) Applicant: GlobalFoundries U.S. Inc., Malta, NY (US)

(72) Inventors: Xiaoxiao Li, Shanghai (CN); Lei Zhang, Wuhan (CN)

(73) Assignee: GlobalFoundries U.S. Inc., Malta, NY (US)

( * ) Notice: Subject to any disclaimer, the term of this patent is extended or adjusted under 35 U.S.C. 154(b) by 75 days.

(21) Appl. No.: 17/655,389

(22) Filed: Mar. 18, 2022

(65) Prior Publication Data

US 2023/0298681 A1    Sep. 21, 2023

(51) Int. Cl.
*G11C 29/00* (2006.01)
*G06F 1/06* (2006.01)
*G11C 29/12* (2006.01)
*H03K 3/037* (2006.01)
*G11C 11/417* (2006.01)

(52) U.S. Cl.
CPC .......... *G11C 29/12015* (2013.01); *G06F 1/06* (2013.01); *H03K 3/037* (2013.01); *G11C 11/417* (2013.01)

(58) Field of Classification Search
CPC ... G11C 29/12015; G11C 11/417; G06F 1/06; H03K 3/037
See application file for complete search history.

(56) References Cited

U.S. PATENT DOCUMENTS

| | | | |
|---|---|---|---|
| 9,761,329 B2 | 9/2017 | Busi et al. | |
| 2009/0079483 A1* | 3/2009 | Keskin | H03K 3/037 326/104 |
| 2011/0063929 A1* | 3/2011 | Raghunathan | H03K 3/0375 365/189.05 |
| 2012/0194373 A1* | 8/2012 | Steinbach | H03M 1/661 341/144 |

\* cited by examiner

*Primary Examiner* — Samir W Rizk
(74) *Attorney, Agent, or Firm* — David Cain; Hoffman Warnick LLC (57) ABSTRACT

Embodiments of the present disclosure provide a level-sensitive register unit, including: a data latch for receiving data; a flip-flop including a first latch and a second latch, wherein an output of the data latch is coupled to an input of the first latch of the flip-flop; a first clock signal coupled to the data latch; and a second clock signal, wherein the second latch of the flip-flop is clocked by the second clock signal, and wherein the first latch of the flip-flop is clocked by an inverse of the second clock signal.

17 Claims, 8 Drawing Sheets

METHOD AND SYSTEM FOR TESTING OF MEMORY

TECHNICAL FIELD

Embodiments of the disclosure relate generally to integrated circuit testing. More specifically, the disclosure provides a method and system for testing of memory.

BACKGROUND

Level-sensitive cells have been used for hold time padding when performing race-free, full process, voltage, and temperature (PVT) testing of memory. However, such testing of memory is not applicable to all memories or technologies. For example, a level-sensitive cell is generally designed for use with a specific memory and is not included in most technology libraries. Also, many memories require a dedicated pin (e.g., LSMODE) for testing that is held low during a functional mode and asserted high during voltage testing to invert the internal clock of the memory to provide interface timing (e.g., hold time). Further, the base (functional) clock (BCLK) of many built-in self-test (BIST) systems cannot be inverted, which precludes the use of falling edge clock D-type flip flops (DFFN) in the test logic path.

SUMMARY

Aspects of the disclosure provide a level-sensitive register unit, including: a data latch for receiving data; a flip-flop including a first latch and a second latch, wherein an output of the data latch is coupled to an input of the first latch of the flip-flop; a first clock signal coupled to the data latch; and a second clock signal, wherein the second latch of the flip-flop is clocked by the second clock signal, and wherein the first latch of the flip-flop is clocked by an inverse of the second clock signal.

Another aspect of the disclosure is directed to a memory built-in self-test system, including: a memory; and a first level-sensitive register unit for writing data to the memory, the first level-sensitive memory unit including: a data latch for receiving data; a flip-flop including a first latch and a second latch, wherein an output of the data latch is coupled to an input of the first latch of the flip-flop; a clock signal coupled to the data latch; and a second clock signal, wherein the second latch of the flip-flop is clocked by the second clock signal, and wherein the first latch of the flip-flop is clocked by an inverse of the second clock signal.

A further aspect of the disclosure is directed to a method, the method including: clocking a level-sensitive register unit coupled to a memory with a first clock signal and a second clock signal, the level-sensitive register unit including a data latch coupled to a flip-flop including a first latch and a second latch, wherein the data latch is clocked by the first clock signal, the first latch of the flip-flop is clocked by an inverse of the second clock signal, and the second latch of the flip-flop is clocked by the second clock signal; and clocking the memory with the second clock signal, wherein a frequency of the first clock signal is 2× a frequency of the second clock signal.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 1:
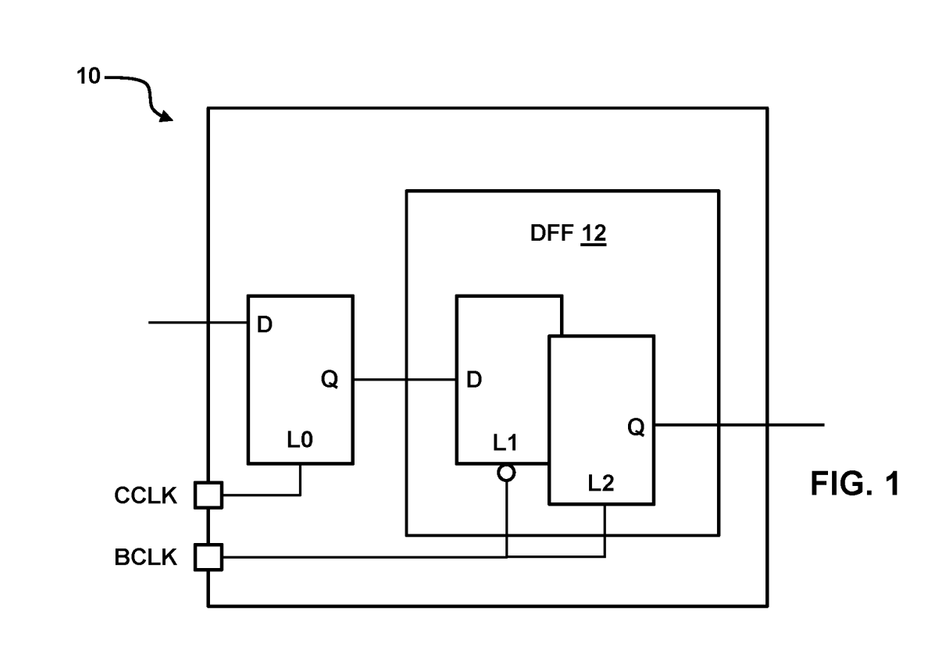
FIG. 1 depicts a level-sensitive register unit in accordance with embodiments of the disclosure.

A level-sensitive register unit 10 for test logic in accordance with embodiments of the disclosure is depicted in FIG. 1. As shown, the level-sensitive register unit 10 includes a latch L0 and a D-type flip flop (DFF) 12 including latches L1 and L2. Latch L0 of the level-sensitive register unit 120 is clocked by a clock signal CCLK, which is used for hold time padding. Latch L2 of DFF 12 is clocked by the functional clock signal BCLK and latch L1 of DFF 12 is clocked by the inverse of BCLK (~BCLK). Latch L0 and DFF 12 may be implemented in a conventional manner using a latch and DFF found in most technical libraries. However, according to embodiments of the disclosure, an innovative clocking method is disclosed herein for the level-sensitive register unit 10.

When the level-sensitive register unit 10 is in a level-sensitive mode, latch L0 is clocked by the clock signal CCLK and holds data before a rising edge of BLCK reaches DFF 12. In a normal edge mode, the clock signal CCLK is tied to high and latch L0 is transparent. In this case, the level-sensitive register unit 10 operates as a D-type flip-flop.

Figure 2:
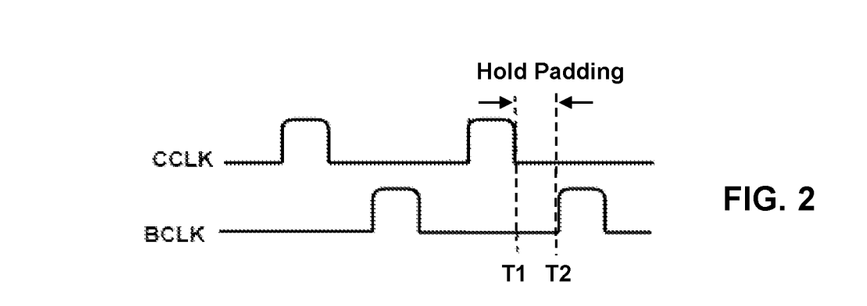
FIG. 2 is a timing diagram depicting the hold time padding provided by the level-sensitive register unit of FIG. 1 according to embodiments of the disclosure.

FIG. 2 is a timing diagram depicting the hold time padding provided by the level-sensitive register unit 10 of FIG. 1 according to embodiments of the disclosure. As shown, at time T1, the falling edge of the clock signal CCLK will hold the data in latch L1 unchanged. At time T2, at the rising edge of the clock signal BCLK, the data in latch L1 will be captured by latch L2, even if the data input to latch L1 has changed. The elapsed time between time T1 and T2 is the hold time.

Figure 3:
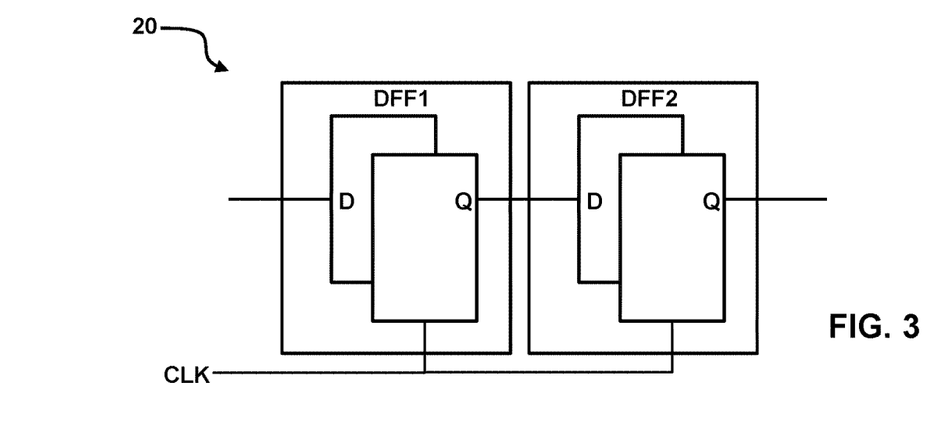
FIG. 3 depicts a circuit including an arrangement of conventional D-type flip-flops.
Figure 4:
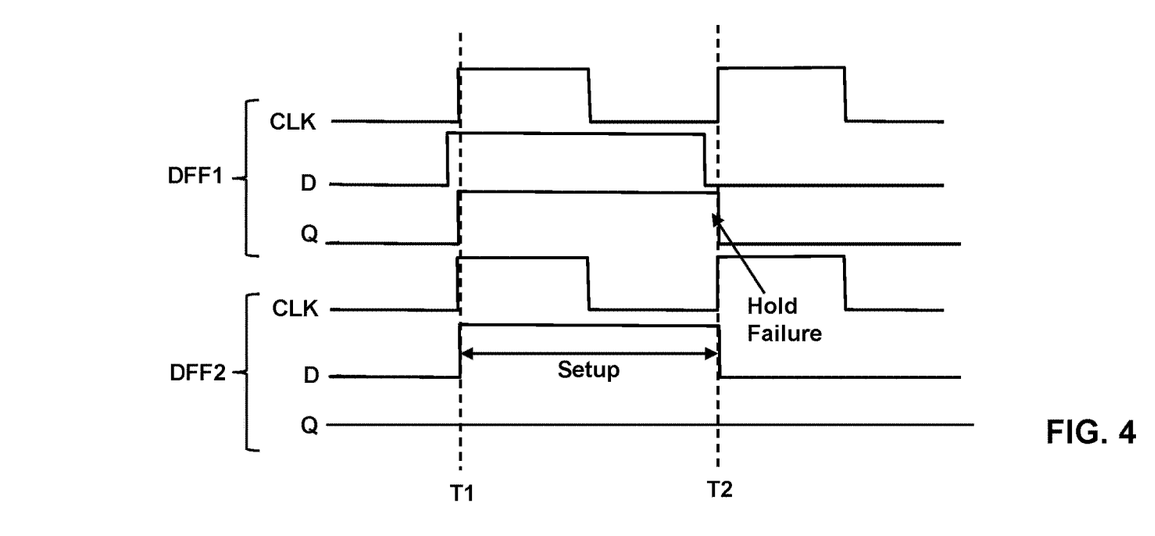
FIG. 4 is a timing diagram depicting a hold failure in the circuit depicted in FIG. 3.

FIG. 3 depicts a circuit 20 including an arrangement of conventional D-type flip-flops DFF1, DFF2, where the output Q of DFF1 is provided to a data input D of DFF2. FIG. 4 is a timing diagram depicting a hold failure in the circuit 20. As shown in FIG. 4, the D input of DFF2 is setup as 1 at time T1 but fails to pass to the Q output of DFF2 due to a hold failure.

Figure 5:
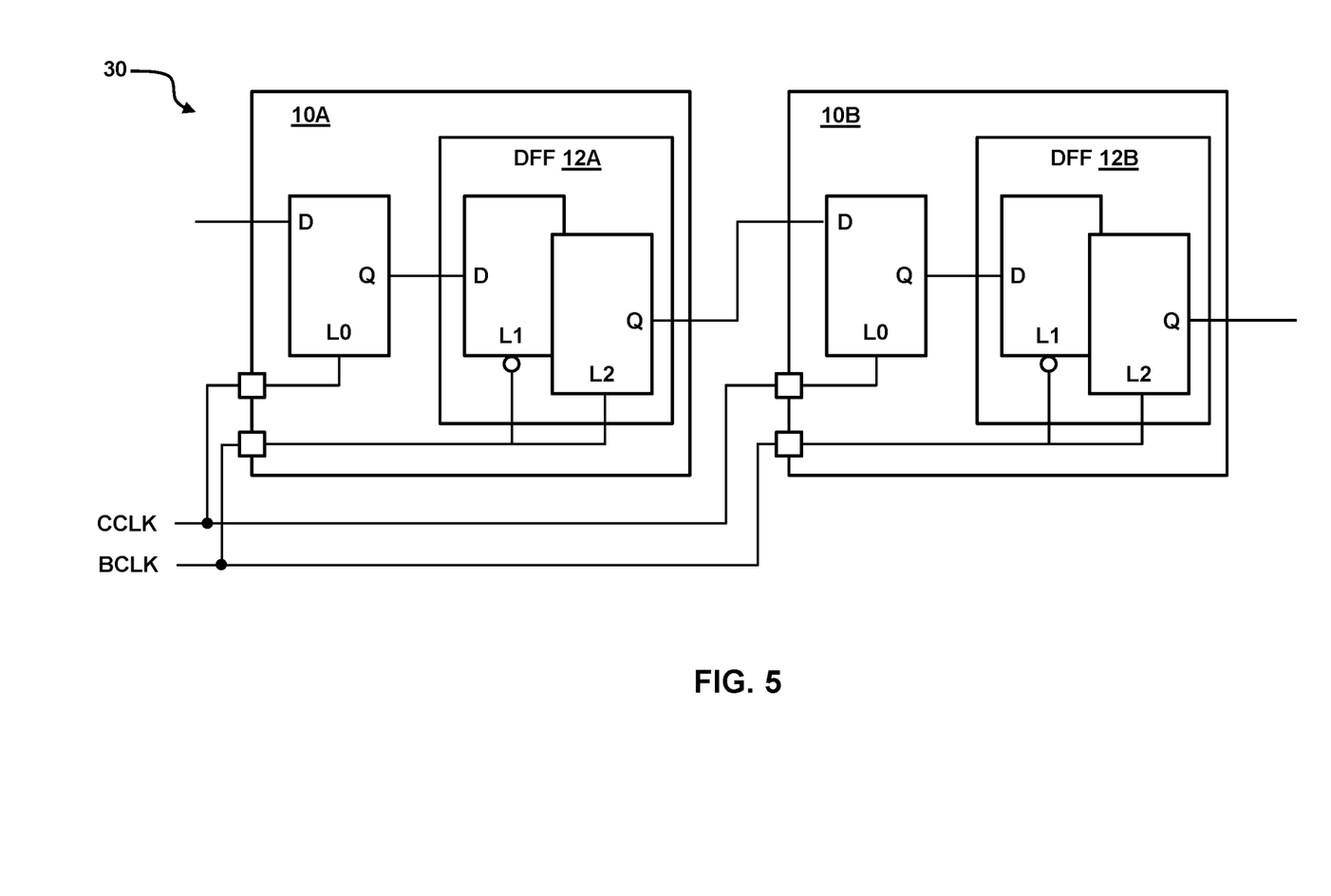
FIG. 5 depicts a circuit including an arrangement of level-sensitive register units according to embodiments of the disclosure.
Figure 6:
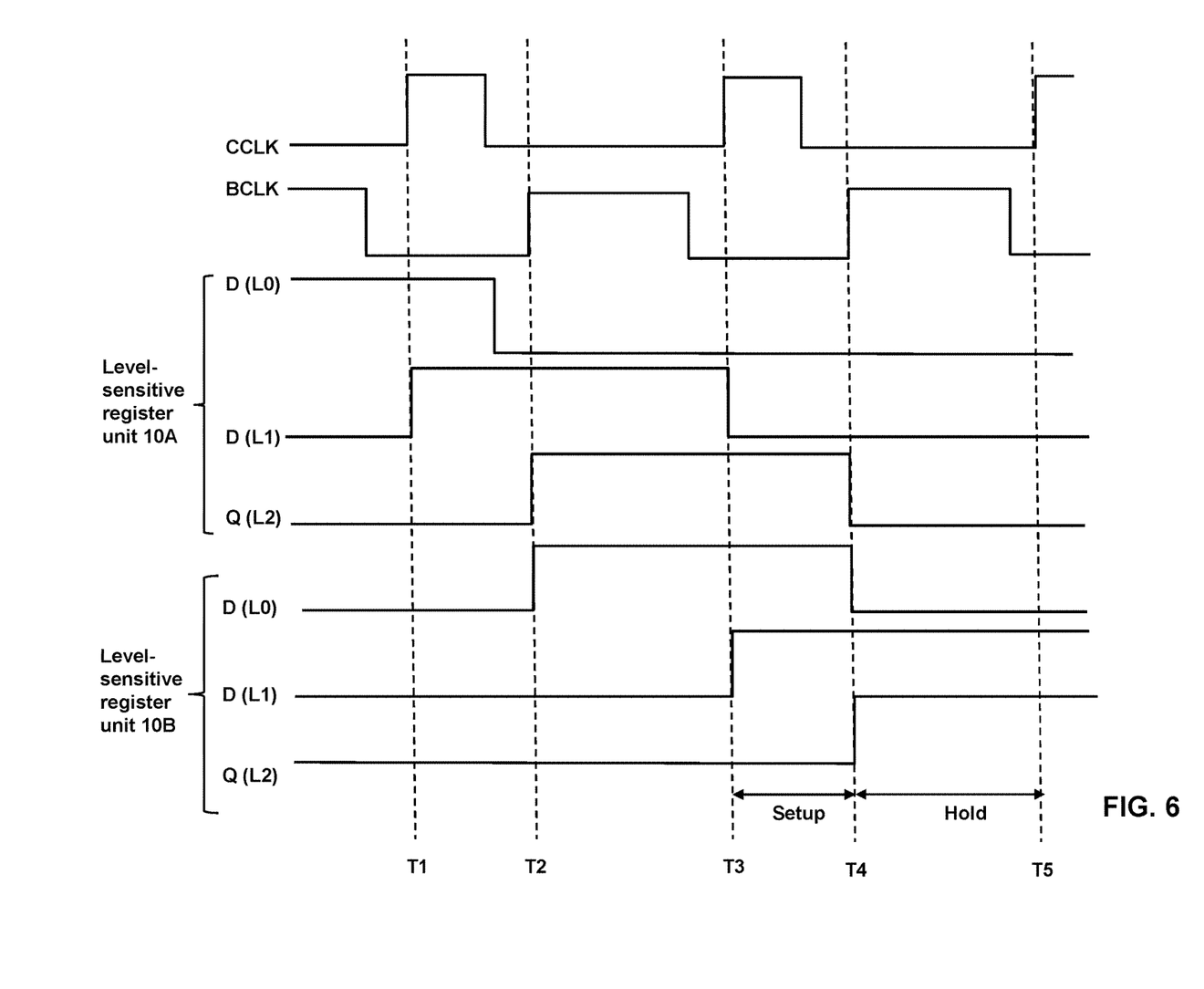
FIG. 6 is a timing diagram depicting the hold time padding provided by the circuit depicted in FIG. 5 according to embodiments of the disclosure.

FIG. 5 depicts a circuit 30 including an arrangement of level-sensitive register units 10A, 10B according to embodiments of the disclosure, where the output Q of DFF 12A of the level-sensitive register unit 10A is provided to a data input D of latch L0 of the level-sensitive register unit 10B. FIG. 6 is a timing diagram depicting how the clock signal CCLK provides hold time padding in the circuit 30.

In FIG. 6, at time T1, at the rising edge of the clock signal CCLK, the data at the data input D of latch L0 of the level-sensitive register unit 10A is passed to the data input D of latch L1 of DFF 12A. At time T2, at the next rising edge of the clock signal BCLK, the data at the data input D of latch L1 of DFF 12A is passed to the output Q of latch L2 of DFF 12A and the data input D of latch L0 of the level-sensitive register unit 10B. At time T3, at the next rising edge of the clock signal CCLK, the data at the data input D of latch L0 of the level-sensitive register unit 10B is passed (e.g., setup) to the data input D of latch L1 of DFF 12B. At time T4, at the next rising edge of the clock signal BCLK, the data at the data input D of latch L1 of DFF 12B of the level-sensitive register unit 10B is passed to the output Q of latch L2 of DFF 12B. The data is held at the output Q of latch L2 of DFF 12B until the next rising edge of the clock signal CCLK (time T5).

According to embodiments of the disclosure, referring again to FIG. 6, the frequency of the clock signal CCLK is 2× the frequency of the clock signal BCLK. Advantageously, this will provide hold time padding for both rising and falling edge D-type flip-flops, DFF, DFFN.

Figure 7:
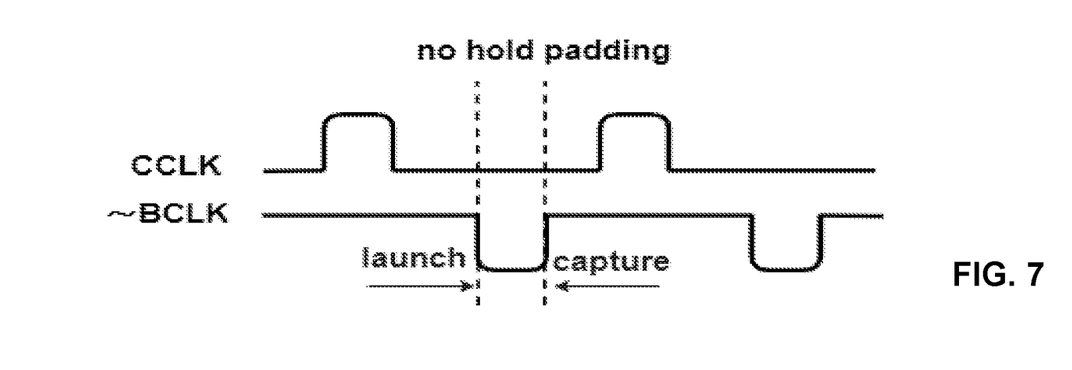
FIG. 7 is a timing diagram illustrating hold time padding failure that may occur when a falling edge D-type flip-flop (DFFN) and an inverted clock signal BCLK (~BCLK) are included in a test path.

As discussed above, the base (functional) clock (BCLK) of many BIST systems cannot be inverted, which precludes the use of falling edge clock D-type flip flops (DFFN) in conventional test logic paths. This issue is depicted, for example, in FIG. 7, which depicts a timing diagram similar to that provided in FIG. 2, with the exception that the clock signal BCLK is now inverted (~BCLK). As shown in FIG. 7, and when compared to FIG. 2, the use of the clock signal ~BCLK does not provide hold time padding.

Figure 8:
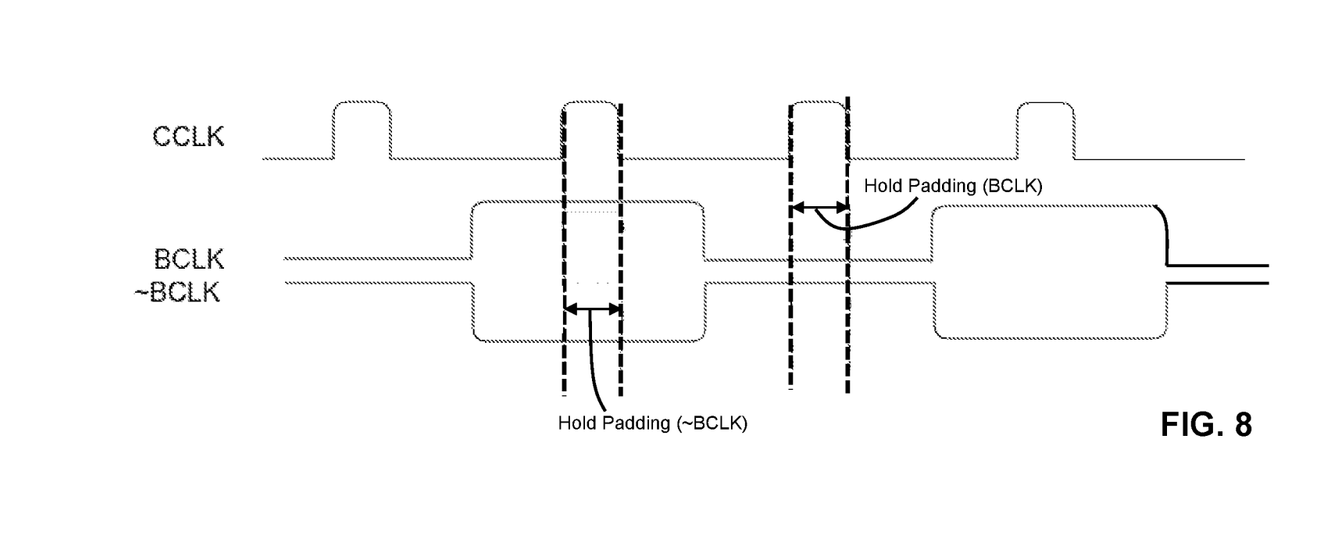
FIG. 8 depicts a timing diagram in which the clock signal CCLK is 2× the frequency of the clock signal BCLK (and ~BLCK) according to embodiments of the disclosure.

FIG. 8 depicts a timing diagram in which the clock signal CCLK is 2× the frequency of the clock signal BCLK (and ~BLCK) according to embodiments of the disclosure. As shown, hold time padding is now provided for the clock signals BCLK and ~BLCK, allowing the use of rising and falling edge D-type flip-flops, DFF, DFFN in test logic paths.

Figure 9:
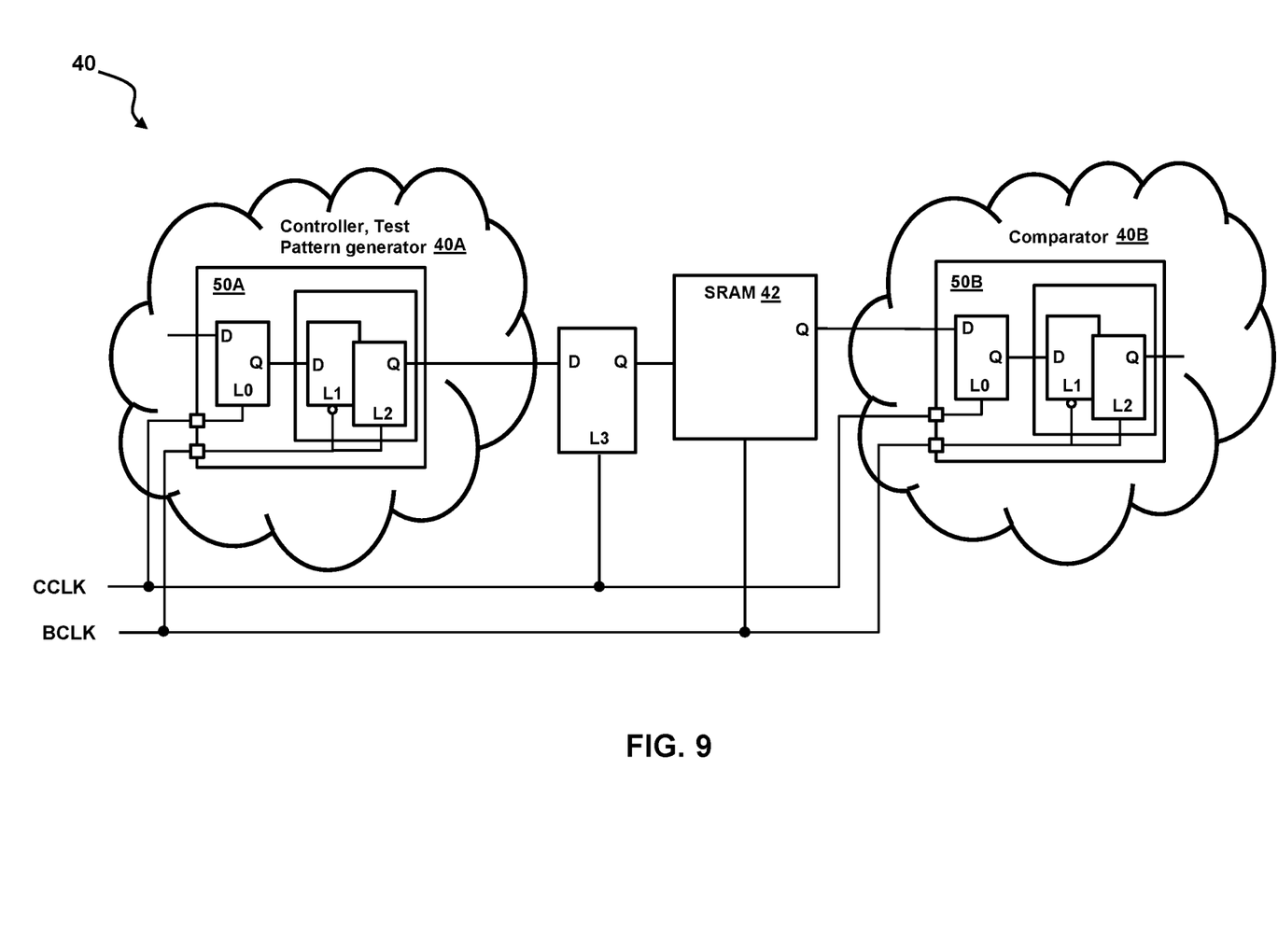
FIG. 9 depicts a memory built-in self-test (MBIST) system according to embodiments of the disclosure.

A memory built-in self-test (MBIST) 40 for testing a memory 42 (e.g., a static random access memory (SRAM)) according to embodiments of the disclosure is depicted in FIG. 9. In general, as known in the art, the MBIST 40 is configured to perform sequences of reads and writes to/from the memory 42 according to a test algorithm. According to embodiments of the disclosure, the memory 42 does not require a dedicated pin (e.g., LSMODE) for testing that is held low during a functional mode and asserted high during voltage testing to provide interface timing.

The MBIST 40 generally includes a controller and a test pattern generator for generating the address, data, and control values to create each test pattern that is to be applied to the memory 42 being tested. The MBIST 40 also includes a comparator for comparing the data read out of the memory 42 with expected data (e.g., the data generated by the test pattern generator). The written (expected) data and read data are compared and the results are reported (e.g., by a simple pass/fail status), or in more complex designs, more elaborate logic is implemented for diagnosing, debugging, and the like.

In FIG. 9, for example, the MBIST 40 is depicted in two sections for sake of discussion, including a first section 40A including the hardware/software/logic required to implement the controller and test pattern generator, sequence the addresses, and write and read test patterns to/from the memory 42. A second section 40B of the MBIST 40 includes the hardware/software/logic required to implement the functionality of the comparator.

According to embodiments of the disclosure, as depicted in FIG. 9, the MBIST 40 may include a set of level-sensitive register units 50A for writing data to the memory 42 and a set of level-sensitive latch 50B for reading data from the memory 42. The level-sensitive register units 50A, 50B may be implemented, for example, using the level-sensitive register unit 10 depicted in FIG. 1. A retiming latch L3 may also be inserted between the level-sensitive register unit 50A and the test inputs of the memory 42 to provide retiming of the clock signal CCLK, if necessary.

As depicted in FIG. 9, latch L0 of the level-sensitive register unit 50A, latch L0 of the level-sensitive register unit 50B, and the retiming latch L3 are clocked by the clock signal CCLK. Latch L2 of the level-sensitive register unit 50A, latch L2 of the level-sensitive register unit 50B, and the memory 42 are clocked by the clock signal BCLK. Further, latch L1 of the level-sensitive register unit 50A and latch L1 of the level-sensitive register unit 50B are clocked by inverse of the clock signal BCLK (~BCLK).

Figure 10:
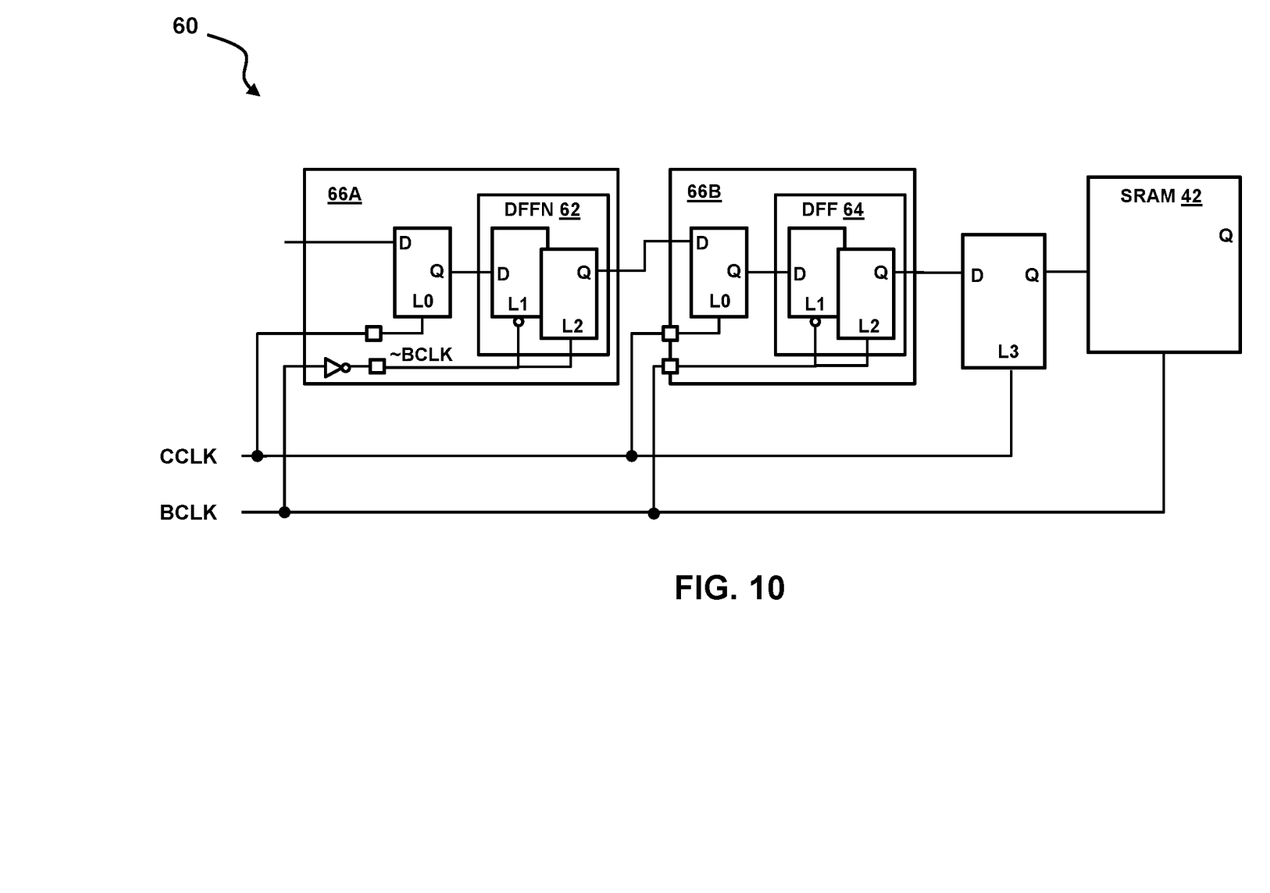
FIG. 10 depicts a circuit for use in a MBIST that is configured to provide hold time padding for both rising and falling edge D-type flip-flops, DFF, DFFN in accordance with embodiments of the disclosure.
Figure 11:
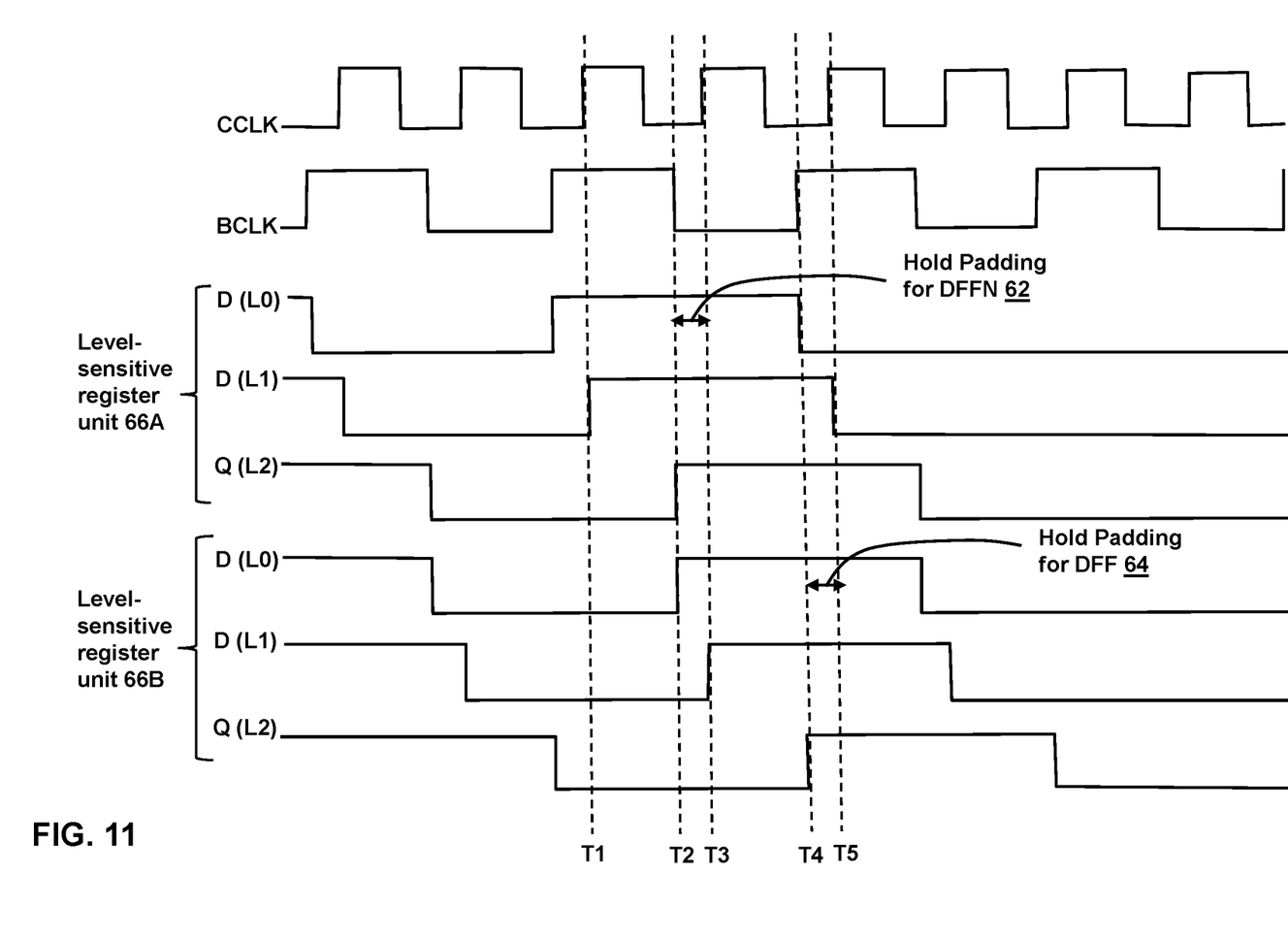
FIG. 11 depicts a timing diagram for the circuit of FIG. 10 according to embodiments of the disclosure.

FIG. 10 depicts a circuit 60 for use in a MBIST that is configured to provide hold time padding for both rising and falling edge D-type flip-flops, DFF, DFFN in accordance with embodiments of the disclosure. In the circuit 60, the clock signal CCLK is 2× the frequency of the functional clock signal BCLK. The circuit 60 include a level-sensitive register unit 66A including a DFFN 62 and a level-sensitive register unit 66B including a DFF 64. An inverter 68 is provided in the level-sensitive register unit 66A to invert the clock signal BCLK. FIG. 11 is a timing diagram for the circuit 60.

Latch L0 in the level-sensitive register units 66A and 66B is clocked by a clock signal CCLK, which is used for hold time padding. In the level-sensitive register unit 66A, latch L2 is clocked by the inverse clock signal ~BCLK and latch L1 is clocked by the clock signal BCLK. In the level-sensitive register unit 66B, latch L2 is clocked by the clock signal BCLK and latch L1 is clocked by the clock signal ~BCLK.

In FIG. 11, at time T1, at a rising edge of the clock signal CCLK, the data at the data input D of latch L0 of the level-sensitive register unit 66A is passed to the data input D of latch L1 of DFFN 62. At time T2, at the next falling edge of the clock signal BCLK, the data at the data input D of latch L1 of DFFN 62 is passed to the output Q of latch L2 of DFFN 62 and the data input D of latch L0 of the level-sensitive register unit 66B. At time T3, at the next rising edge of the clock signal CCLK, the data at the data input D of latch L0 of the level-sensitive register unit 66B is passed to the data input D of latch L1 of DFF 64. As shown in FIG. 11, hold time padding for DFFN 62 is provided from time T2 to time T3.

At time T4, at the next rising edge of the clock signal BCLK, the data at the data input D of latch L1 of DFF 64 of the level-sensitive register unit 66B is passed to the output Q of latch L2 of DFF 64. The data is held at the output Q of latch L2 of DFF 64 until the next rising edge of the clock signal CCLK (time T5). As indicated in FIG. 11, hold time padding for DFF 64 is provided from time T4 to time T5.

According to embodiments of the disclosure, a specific level-sensitive cell is no longer required when testing a memory. Rather, a level-sensitive register unit may be provided using a conventional latch and DFF. In addition, the memory under test no longer requires a dedicated pin (e.g., LSMODE) for testing that is held low during a functional mode and asserted high during voltage testing to invert the internal clock of the memory to provide interface timing. Further, the limitation that the clock signal BCLK cannot be inverted at any node during memory testing is eliminated.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other components, engagement of one or more of the device or other components, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A level-sensitive register unit, comprising:
   a data latch for receiving data;
   a flip-flop including a first latch and a second latch, wherein an output of the data latch is coupled to an input of the first latch of the flip-flop;
   a first clock signal coupled to the data latch; and
   a second clock signal, wherein a frequency of the first clock signal is 2× a frequency of the second clock signal,
   wherein the second latch of the flip-flop is clocked by the second clock signal, and wherein the first latch of the flip-flop is clocked by an inverse of the second clock signal.

2. The level-sensitive register unit according to claim 1, wherein, in a normal edge mode, the first clock signal is held high and the data latch is transparent.

3. The level-sensitive register unit according to claim 1, wherein, in a level- sensitive mode, the data latch is clocked by the first clock signal.

4. The level-sensitive register unit according to claim 3, wherein, at a rising edge of the first clock signal, data at a data input of the data latch is passed to a data input of the first latch of the flip-flop.

5. The level-sensitive register unit according to claim 3, wherein a falling edge of the first clock signal holds data in the first latch of the flip-flop unchanged, and wherein, at a next rising edge of the second clock signal, the data in the first latch of the flip-flop is captured by the second latch of the flip-flop.

6. The level-sensitive register unit according to claim 5, wherein the data is held at an output of the second latch of the flip-flop until a next rising edge of the first clock signal.

7. The level-sensitive register unit according to claim 1, wherein the level-sensitive register unit is included in a memory built-in self-test system.

8. A memory built-in self-test system, comprising:
   a memory; and
   a first level-sensitive register unit for writing data to the memory, the first level-sensitive memory unit including:
   a data latch for receiving data;
   a flip-flop including a first latch and a second latch, wherein an output of the data latch is coupled to an input of the first latch of the flip-flop;
   a first clock signal coupled to the data latch; and
   a second clock signal, wherein a frequency of the first clock signal is 2× a frequency of the second clock signal, wherein the second latch of the flip-flop is clocked by the second clock signal, and wherein the first latch of the flip-flop is clocked by an inverse of the second clock signal.

9. The memory built-in self-test system according to claim 8, further comprising a retiming latch coupled between a data output of the second latch of the flip-flop and the memory.

10. The memory built-in self-test system according to claim 8, wherein, in a normal edge mode, the first clock signal is held high and the data latch is transparent.

11. The memory built-in self-test system according to claim 8, wherein, in a level-sensitive mode, the data latch is clocked by the first clock signal.

12. The memory built-in self-test system according to claim 11, wherein, at a rising edge of the first clock signal, data at a data input of the data latch is passed to a data input of the first latch of the flip-flop.

13. The memory built-in self-test system according to claim 11, wherein a falling edge of the first clock signal holds data in the first latch of the flip-flop unchanged, and wherein, at a next rising edge of the second clock signal, the data in the first latch of the flip-flop is captured by the second latch of the flip-flop.

14. The memory built-in self-test system according to claim 13, wherein the data is held at an output of the second latch of the flip-flop until a next rising edge of the first clock signal.

15. The memory built-in self-test system according to claim 8, further comprising a second level-sensitive register unit for reading data from the memory, the second level-sensitive memory unit including:
 a transparent latch coupled to the first clock signal for receiving data from the memory; and
 a second flip-flop including a first latch and a second latch, wherein an output of the transparent latch is coupled to an input of the first latch of the second flip-flop,
wherein the second latch of the second flip-flop is clocked by the second clock signal, and wherein the first latch of the second flip-flop is clocked by the inverse of the second clock signal.

16. A method, comprising:
 clocking a level-sensitive register unit coupled to a memory with a first clock signal and a second clock signal, the level-sensitive register unit including a data latch coupled to a flip-flop, the flip-flop including a first latch and a second latch, wherein the data latch is clocked by the first clock signal, the first latch of the flip-flop is clocked by an inverse of the second clock signal, and the second latch of the flip-flop is clocked by the second clock signal; and
 clocking the memory with the second clock signal,
wherein a frequency of the first clock signal is 2× a frequency of the second clock signal.

17. The method according to claim 16, wherein a retiming latch is coupled between the level-sensitive register unit and the memory, wherein the method further comprises clocking the retiming latch with the first clock signal.

* * * * *